(12) United States Patent
Campbell et al.

(10) Patent No.: US 8,713,955 B2
(45) Date of Patent: May 6, 2014

(54) INTRA-CONDENSER CONTAMINANT EXTRACTOR FOR A VAPOR-COMPRESSION REFRIGERATION APPARATUS

(75) Inventors: Levi A. Campbell, Poughkeepsie, NY (US); Richard C. Chu, Hopewell Junction, NY (US); Evan G. Colgan, Chestnut Ridge, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 13/271,290

(22) Filed: Oct. 12, 2011

(65) Prior Publication Data

US 2013/0091886 A1    Apr. 18, 2013

(51) Int. Cl.
*F25D 23/12*    (2006.01)

(52) U.S. Cl.
USPC .......................................... 62/259.1

(58) Field of Classification Search
USPC ............ 62/259.1, 303, 474, 498; 29/890.035; 165/80.2
See application file for complete search history.

(56) References Cited

U.S. PATENT DOCUMENTS

| | | | |
|---|---|---|---|
| 5,269,146 A | 12/1993 | Kerner | |
| 5,896,922 A * | 4/1999 | Chrysler et al. | 165/165 |
| 6,557,354 B1 | 5/2003 | Chu et al. | |
| 6,567,262 B2 | 5/2003 | Meir | |
| 6,635,655 B1 * | 10/2003 | Jayyosi et al. | 514/311 |
| 7,403,384 B2 | 7/2008 | Pflueger | |
| 7,817,423 B2 | 10/2010 | Morehead | |
| 7,885,070 B2 | 2/2011 | Campbell et al. | |
| 7,916,483 B2 | 3/2011 | Campbell et al. | |
| 7,944,694 B2 | 5/2011 | Campbell et al. | |
| 7,961,475 B2 | 6/2011 | Campbell et al. | |
| 7,983,040 B2 | 7/2011 | Campbell et al. | |
| 2008/0186670 A1 | 8/2008 | Lyon et al. | |
| 2011/0096504 A1 | 4/2011 | Hild | |
| 2011/0103019 A1 | 5/2011 | Campbell et al. | |

OTHER PUBLICATIONS

Seely, J.H., "Cooling System", IBM Technical Disclosure Bulletin, IPCOM000089944D, Mar. 5, 2005.
Bar-Cohen, A., "Thermal Management of On-Chip Hot Spots and 3D Chip Stacks", Microwaves, Communications, Antennas and Electronics Systems, COMCAS, IEEE International Conference on Digital Object Identifier (2009).

(Continued)

*Primary Examiner* — Melvin Jones
(74) *Attorney, Agent, or Firm* — Dennis Jung, Esq.; Kevin P. Radigan, Esq.; Heslin Rothenberg Farley & Mesiti P.C.

(57) ABSTRACT

Apparatuses and methods are provided for facilitating cooling of an electronic component. The apparatus includes a vapor-compression refrigeration system. The vapor-compression refrigeration system includes an expansion component, an evaporator, a compressor, and a condenser coupled in fluid communication via a refrigerant flow path. The evaporator is coupled to and cools the electronic component. The apparatus further includes a contaminant extractor coupled in fluid communication with the refrigerant flow path. The extractor includes a refrigerant boiling filter and a heater. At least a portion of refrigerant passing through the refrigerant flow path passes through the refrigerant boiling filter, and the heater provides heat to the refrigerant boiling filter to boil refrigerant passing through the filter. By boiling refrigerant passing through the filter, contaminants are extracted from the refrigerant, and are deposited in the refrigerant boiling filter.

20 Claims, 5 Drawing Sheets

(56) References Cited

OTHER PUBLICATIONS

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

Campbell et al., "Thermoelectric-Enhanced, Liquid-Cooling Apparatus and Method for Facilitating Dissipation of Heat", U.S. Appl. No. 12/845,355, filed Jul. 28, 2010.

Campbell et al., "Thermoelectric-Enhanced, Refrigeration Cooling of an Electronic Component", U.S. Appl. No. 12/939,569, filed Nov. 4, 2010.

* cited by examiner

INTRA-CONDENSER CONTAMINANT EXTRACTOR FOR A VAPOR-COMPRESSION REFRIGERATION APPARATUS

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within an electronics (or IT) rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, the shortcomings of the prior art are overcome and additional advantages are provided through the provision of an apparatus for facilitating cooling of an electronic component. The apparatus includes a vapor-compression refrigeration system and a contaminant extractor. The vapor-compression refrigeration system includes a refrigerant expansion component, a refrigerant evaporator, a compressor, and a condenser coupled in fluid communication to define a refrigerant flow path and allow the flow of refrigerant therethrough. The refrigerant evaporator is configured to couple to the electronic component to be cooled. The contaminant extractor is coupled in fluid communication with the refrigerant flow path, and includes a refrigerant boiling filter and a heater. At least a portion of refrigerant passing through the refrigerant flow path passes through the refrigerant boiling filter, and the heater provides heat to the refrigerant boiling filter to boil refrigerant passing therethrough, and therefore facilitates deposition in the refrigerant boiling filter of contaminants extracted from the refrigerant due to boiling of the refrigerant in the refrigerant boiling filter.

In another aspect, a cooled electronic system is provided which includes at least one heat-generating electronic component, a vapor-compression refrigeration system coupled to the at least one heat-generating electronic component, a refrigerant flow path, and a contaminant extractor. The vapor-compression refrigeration system includes a refrigerant expansion component, a refrigerant evaporator, a compressor, and a condenser, and wherein the refrigerant evaporator is coupled to the at least one heat-generating electronic component. The refrigerant flow path couples in fluid communication the refrigerant expansion component, the refrigerant evaporator, the compressor and the condenser. The contaminant extractor includes a refrigerant boiling filter and a heater. At least a portion of refrigerant passing through the refrigerant flow path passes through the refrigerant boiling filter, and the heater provides heat to the refrigerant boiling filter to boil refrigerant passing therethrough, and therefore, facilitates deposition in the refrigerant boiling filter of contaminants extracted from the refrigerant due to boiling of the refrigerant in the refrigerant boiling filter.

In a further aspect, a method of fabricating a vapor-compression refrigeration system for cooling at least one heat-generating electronic component is provided. The method includes: providing a condenser, a refrigerant expansion structure, a refrigerant evaporator, and a compressor; coupling the condenser, refrigerant expansion structure, refrigerant evaporator, and compressor in fluid communication to define a refrigerant flow path; providing a contaminant extractor in fluid communication with the refrigerant flow path, the contaminant extractor including a refrigerant boiling filter, wherein at least a portion of the refrigerant passing through the refrigerant flow path passes through the refrigerant boiling filter, and a heater providing heat to the refrigerant boiling filter to boil refrigerant passing through the refrigerant boiling filter, and facilitates deposition in the refrigerant boiling filter of contaminants extracted from the refrigerant due to boiling of the refrigerant in the refrigerant boiling filter; and providing refrigerant within the refrigerant flow path of the vapor-compression refrigeration system to allow for cooling of the at least one heat-generating electronic component employing sequential vapor-compression cycles, wherein the contaminant extractor removes contaminants from the refrigerant commensurate with the sequential vapor-compression cycles.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise an IT rack with multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the term "liquid-cooled cold plate" or "coolant-cooled structure" refers to any thermally conductive structure having a plurality of channels (or passageways) formed therein for flowing of coolant therethrough. A "coolant-cooled structure" may function, in one example, as a refrigerant evaporator.

As used herein, "refrigerant-to-air heat exchanger" means any heat exchange mechanism characterized as described herein through which refrigerant coolant can circulate; and includes, one or more discrete refrigerant-to-air heat exchangers coupled either in series or in parallel. A refrigerant-to-air heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the refrigerant-to-air heat exchanger can vary without departing from the scope of the invention disclosed herein.

Unless otherwise specified, "refrigerant evaporator" refers to a heat-absorbing mechanism or structure within a refrigeration loop coupled to an electronic component to be cooled. The refrigerant evaporator is alternatively referred to as a "sub-ambient evaporator" when temperature of the refrigerant passing through the refrigerant evaporator is below the temperature of ambient air entering the electronics rack. In one example, the refrigerant evaporator comprises a coolant-cooled structure through which refrigerant passes. Within the refrigerant evaporator, heat is absorbed by evaporating the refrigerant of the refrigerant loop. Still further, "data center" refers to a computer installation containing one or more electronics racks to be cooled. As a specific example, a data center may include one or more rows of rack-mounted computing units, such as server units.

One example of the refrigerant employed in the examples below is R134a refrigerant. However, the concepts disclosed herein are readily adapted to use with other types of refrigerant. For example, R245fa, R404, R12, or R22 refrigerant may be employed.

Reference is made below to the drawings, which are not drawn to scale for ease of understanding, wherein the same reference numbers used throughout different figures designate the same or similar components.

Figure 1:
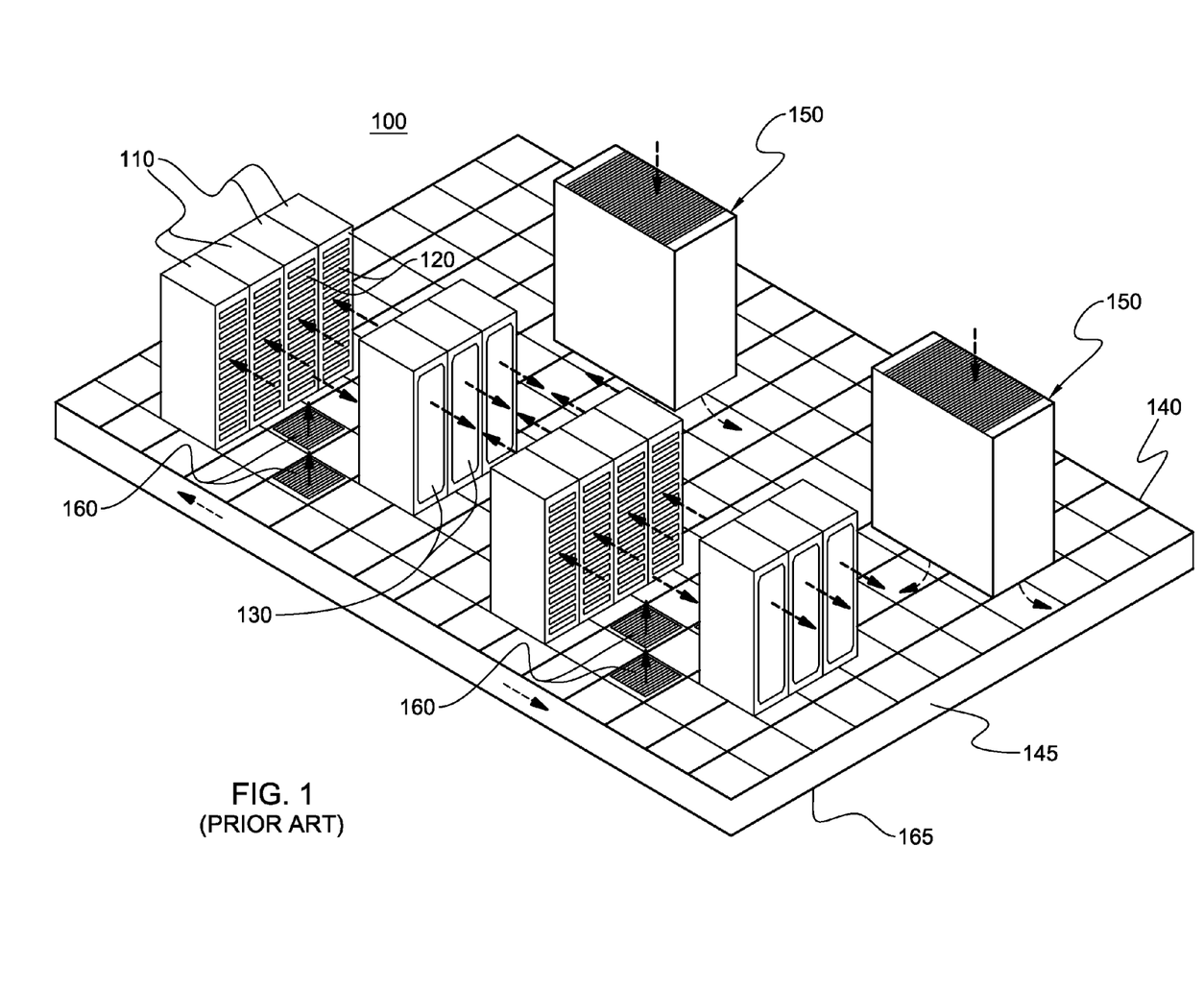
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2A:
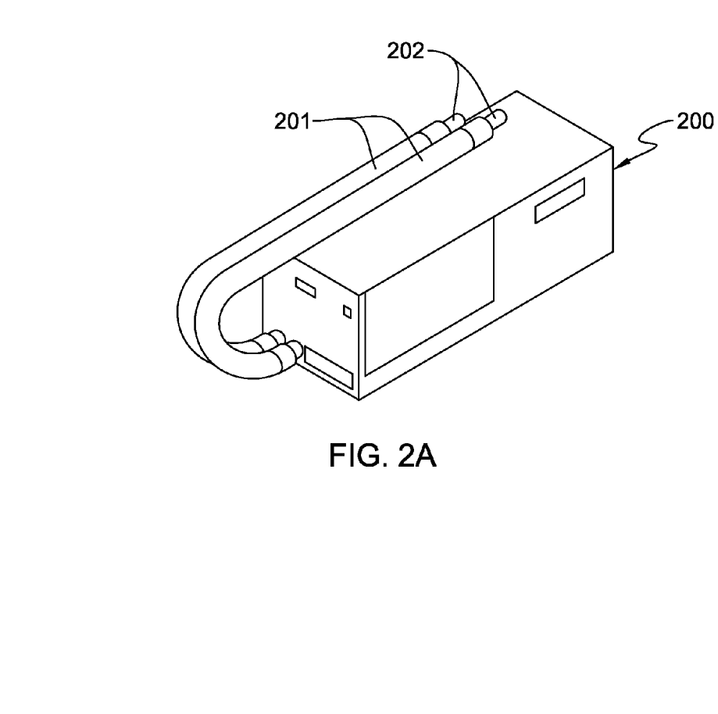
FIG. 2A is an isometric view of one embodiment of a modular refrigeration unit (MRU) and its quick connects for attachment to a cold plate and/or evaporator disposed within an electronics rack to cool one or more electronic components (e.g., modules) thereof, in accordance with one or more aspects of the present invention.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick connect couplings 202, which respectively connect to corresponding quick connect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Pat. No. 5,970, 731.

Figure 2B:
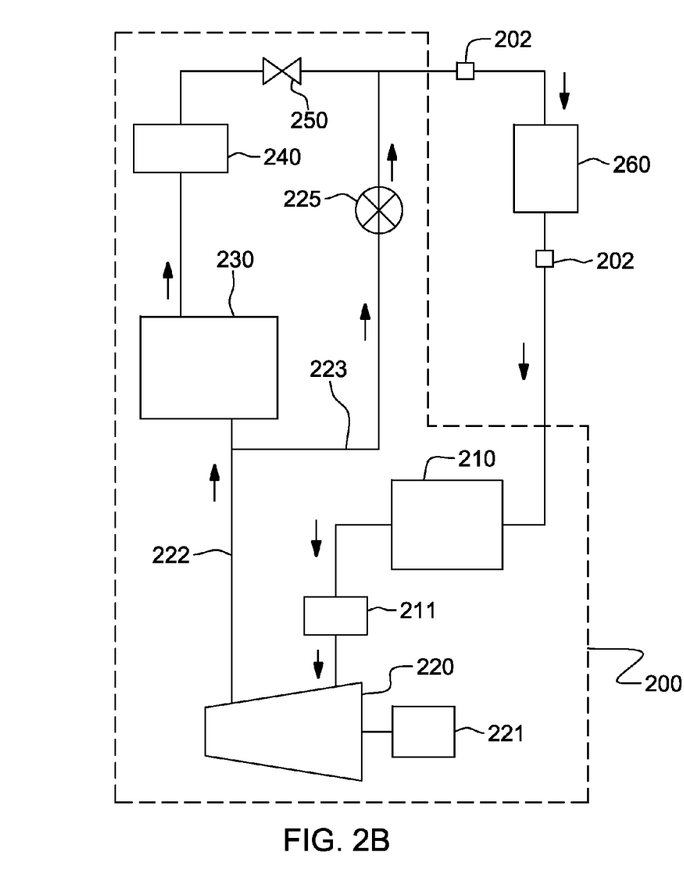
FIG. 2B is a schematic of one embodiment of a vapor-compression refrigeration system for cooling an evaporator (or cold plate) coupled to a high heat flux electronic component (e.g., module) to be cooled, in accordance with one or more aspects of the present invention.

FIG. 2B is a schematic of one embodiment of modular refrigeration unit 200 of FIG. 2A, coupled to a refrigerant evaporator for cooling, for example, an electronic component within an electronic subsystem of an electronics rack. The electronic component may comprise, for example, a multichip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick connect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gasses from compressor 220 directly to evaporator 260. The hot gas bypass valve is controllable in response to the temperature of evaporator 260, which is provided by a module temperature sensor (not shown), such as a thermistor device affixed to the evaporator/ cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

Figure 3:
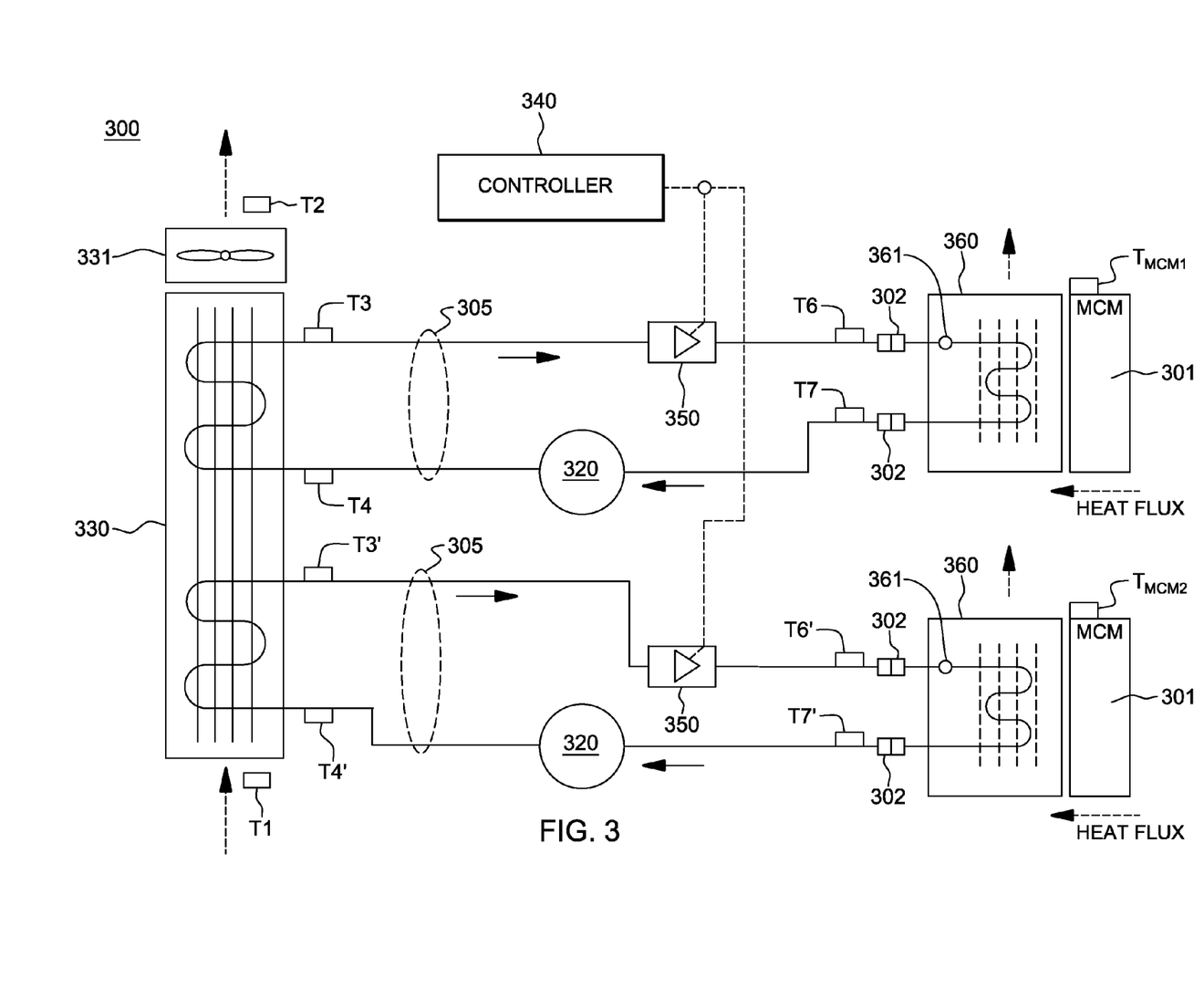
FIG. 3 is an schematic of an alternate embodiment of a vapor-compression refrigeration system for cooling one or more evaporators coupled to respective electronic components to be cooled, in accordance with one or more aspects of the present invention.

FIG. 3 depicts an alternate embodiment of a modular refrigeration unit 300, which may be employed within an electronics rack, in accordance with an aspect of the present invention. Modular refrigeration unit 300 includes (in this example) two refrigerant loops 305, including sets of refrigerant supply and exhaust hoses, coupled to respective refrigerant evaporators (or cold plates) 360 via quick connect couplings 302. Each refrigerant evaporator 360 is in thermal communication with a respective electronic component 301 (e.g., multichip module (MCM)) for facilitating cooling thereof. Refrigerant loops 305 are independent, and shown to include a compressor 320, a respective condenser section of a shared condenser 330 (i.e., a refrigerant-to-air heat exchanger), and an expansion (and flow control) valve 350, which is employed to maintain temperature of the electronic component at a steady temperature level, e.g., 29° C. In one embodiment, the expansion valves 350 are controlled by controller 340 based on the temperature of the respective electronic component 301 $T_{MCM1}$, $T_{MCM2}$. The refrigerant and coolant loops may also contain further sensors, such as sensors for condenser air temperature in T1, condenser air temperature out T2, temperature T3, T3' of high-pressure liquid refrigerant flowing from the condenser 330 to the respective expansion valve 350, temperature T4, T4' of high-pressure refrigerant vapor flowing from each compressor 320 to the respective condenser section 330, temperature T6, T6' of low-pressure liquid refrigerant flowing from each expansion valve 350 into the respective evaporator 360, and temperature T7, T7' of low-pressure vapor refrigerant flowing from the respective evaporator 360 towards the compressor 320. Note that in this implementation, the expansion valves 350 operate to actively throttle the pumped refrigerant flow rate, as well as to function as expansion orifices to reduce the temperature and pressure of refrigerant passing through them. Note also that, in the embodiment depicted, refrigerant evaporators 360 further comprise a fixed orifice 361 integral with the respective evaporator. This fixed orifice functions as a second refrigerant expansion component, which provides a fixed expansion of the refrigerant at, for example, the inlet of the evaporator 360, to provide additional cooling of the refrigerant within the evaporator prior to absorbing heat from the respective electronic component 301.

In situations where electronic component 301 temperature decreases (i.e., the heat load decreases), the respective expansion valve 350 is partially closed to reduce the refrigerant flow passing through the associated evaporator 360 in an attempt to control temperature of the electronic component. If temperature of the component increases (i.e., heat load increases), then the controllable expansion valve 350 is opened further to allow more refrigerant flow to pass through the associated evaporator, thus providing increased cooling to the component.

Figure 4:
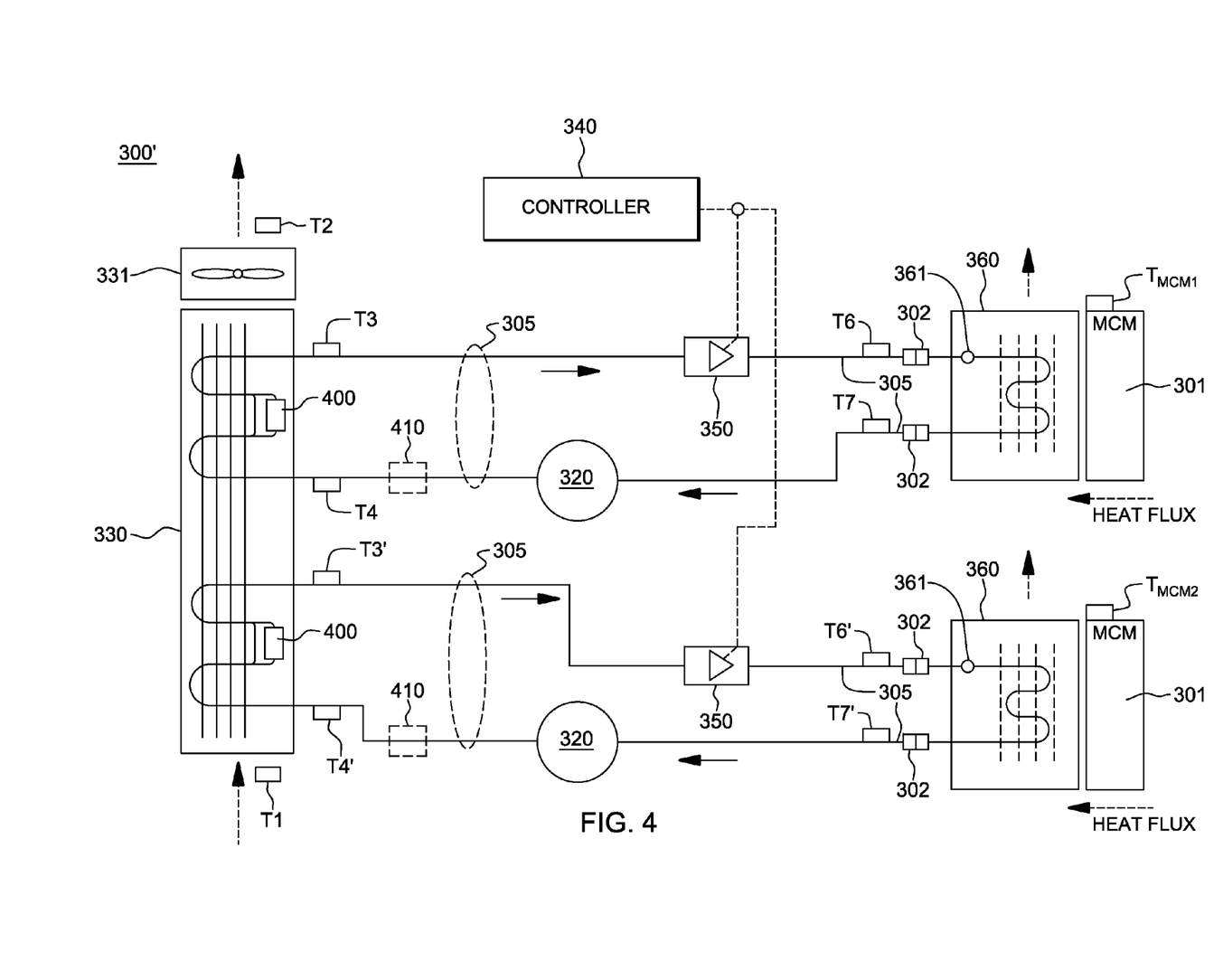
FIG. 4 is a schematic of another embodiment of a vapor-compression refrigeration system for cooling one or more evaporators coupled to one or more respective electronic components to be cooled, and employing a contaminant extractor(s), in accordance with one or more aspects of the present invention.

In accordance with another aspect of the present invention, FIG. 4 depicts a variation of the cooling apparatus of FIG. 3, wherein a contaminant extractor is provided to facilitate removal of contaminants from refrigerant circulating through the refrigerant loop (or refrigerant flow path). In the embodiment of FIG. 4, a dual loop, cooled electronic system is depicted by way of example. However, those skilled in the art should note that the cooling apparatus depicted therein and described below can be readily configured as a single loop or other multi-loop system for cooling a single electronic component, or a plurality of electronic components (either with or without employing a shared condenser, as in the example of FIG. 4).

As described above, vapor-compression cycle refrigeration can be employed to cool electronic components, such as multichip modules, in electronics racks, such as main frame computers. The power variations in the multichip modules and energy efficiency concerns dictate that an electronic expansion valve (EEV) be employed to control the mass flow rate of refrigerant to the evaporator, which as noted above, is conduction coupled to the electronic component (e.g., MCM). Control of the MCM temperature within a desired band is achieved by manipulating the refrigerant flow rate via the EEV. The refrigerant, in practice, is supplemented by a lubricating oil for the compressor, and passes through fittings containing O-rings, and through a filter/dryer. These materials are somewhat mutually soluble, and thus may contaminate the refrigerant. In the EEV, and any other expansion component of the vapor-compression refrigeration loop, the thermodynamic state of the refrigerant and the contaminant mixture is altered, and the contaminants may come out of solution on working components of the system, such as the EEV internal surfaces.

Specifically, it has been discovered that material can agglomerate in certain pressure drop areas of the expansion structures within the refrigeration system. During refrigerant-oil mixture transport, certain impurities and chemically reacted byproducts may come out of solution in the pressure drop areas as the refrigerant cools down. By way of example, an expansion valve may include a first element having an expansion orifice, and a second element having a tapered expansion pin. The expansion pin controls the amount of refrigerant passing through the expansion orifice, through which refrigerant flows. For the cooling applications described hereinabove, the expansion pin is stepped open in very small increments to allow controlled flow of refrigerant through expansion orifice into a pressure drop area of the expansion device. In addition, it has been discovered that material can become deposited within the evaporator due to boiling of refrigerant within the evaporator, which could affect operation of the evaporator over time.

During refrigerant-oil mixture transport through a hot compressor, any long-chain molecules and other typically non-soluble compounds at room temperature can go into solution in the hot mixture. These, as well as other physically transported impurities, then fall out of the solution when the refrigerant-oil mixture cools down, for example, in the pressure drop areas of the expansion structure. A layer of "waxy" material can build up in the pressure drop areas and act as a sticky substance which then catches other impurities. This amassing of material can interfere with the normal control volumes and interfere with the control of motor steps (e.g., due to unpredictable valve characteristic changes). This is particularly true in a vapor compression refrigeration system employed as described above since the control of the expansion valves in this implementation is very sensitive and refrigerant expansion structure geometries are typically very small.

One solution to the problem is depicted in FIG. 4. As noted, cooling apparatus 300' depicted in FIG. 4 is substantially identical to cooling apparatus 300 described above in connection with FIG. 3, with the shared condenser embodiment being depicted by way of example only. The concepts disclosed herein are readily applicable to a cooling apparatus comprising a vapor-compression refrigeration system which embodies a single vapor-compression refrigeration loop configured to facilitate cooling of one or more electronic components coupled to one or more evaporators within the loop.

As noted, cooling apparatus 300' comprises a contaminant extractor 400, which is (in one embodiment) an intra-condenser extractor coupled in fluid communication with the section of the refrigerant loop (or refrigerant flow path) 305 of the vapor-compression refrigeration system that passes through the condenser 330. The contaminant extractor includes a refrigerant boiling filter and a heater. At least a portion of refrigerant passing through the refrigerant flow path passes through the refrigerant boiling filter, and the heater provides heat to the refrigerant boiling filter to boil refrigerant passing through the refrigerant boiling filter. Boiling of the refrigerant in the refrigerant boiling filter allows contaminants to come out of solution (or distill) from the refrigerant due to the boiling of the refrigerant, and thus, facilitates deposition of the contaminants within the refrigerant boiling filter.

FIG. 4 illustrates one implementation of a cooling apparatus comprising an intra-condenser contaminant extractor 400, which is coupled in parallel with a portion of the tubing within condenser 330. In particular, the intra-condenser contaminant extractor is coupled to the condenser 330 at a location within the condenser where the refrigerant comprises a liquid-gas mixture. A portion of this liquid-gas mixture enters the contaminant extractor, which as noted, includes a heater which boils the liquid refrigerant completely, causing any contaminants in the liquid-gas mixture to be extracted (or plated out) onto the surfaces of the extractor at any one time. In one example, less than approximately 25% of the refrigerant passing within the refrigerant flow path within the condenser is directed through the contaminant extractor. In one specific implementation, 10-25% of the refrigerant passing through the condenser is directed through the contaminant extractor. This can be achieved by providing tubing directing a portion of the refrigerant passing through the condenser to also pass through the contaminant extractor. After passing through the contaminant extractor, the high-pressure refrigerant vapor is returned to the condenser for condensing into high-pressure liquid refrigerant for return via the refrigerant flow path to the one or more expansion devices and the evaporator.

Those skilled in the art will note that the contaminant extractor described herein can be disposed in various places within the vapor-compression refrigeration loop. However, by coupling the contaminant extractor in parallel fluid communication with a portion of the refrigerant flow path passing through the condenser, less heat is required in order to boil the portion of refrigerant passing through the filter, and thus, to extract any contaminants within that portion of the refrigerant. During sequential vapor-compression cycles, contaminants are cleaned from the refrigerant by boiling and filtering of the contaminants within the contaminant extractor. The contaminant extractor is advantageously position in the refrigerant stream after the compressor and before the expansion device(s) to remove contaminants that may be introduced within the compressor to prevent the contaminants from reaching the expansion device(s) and evaporator.

Figure 5:
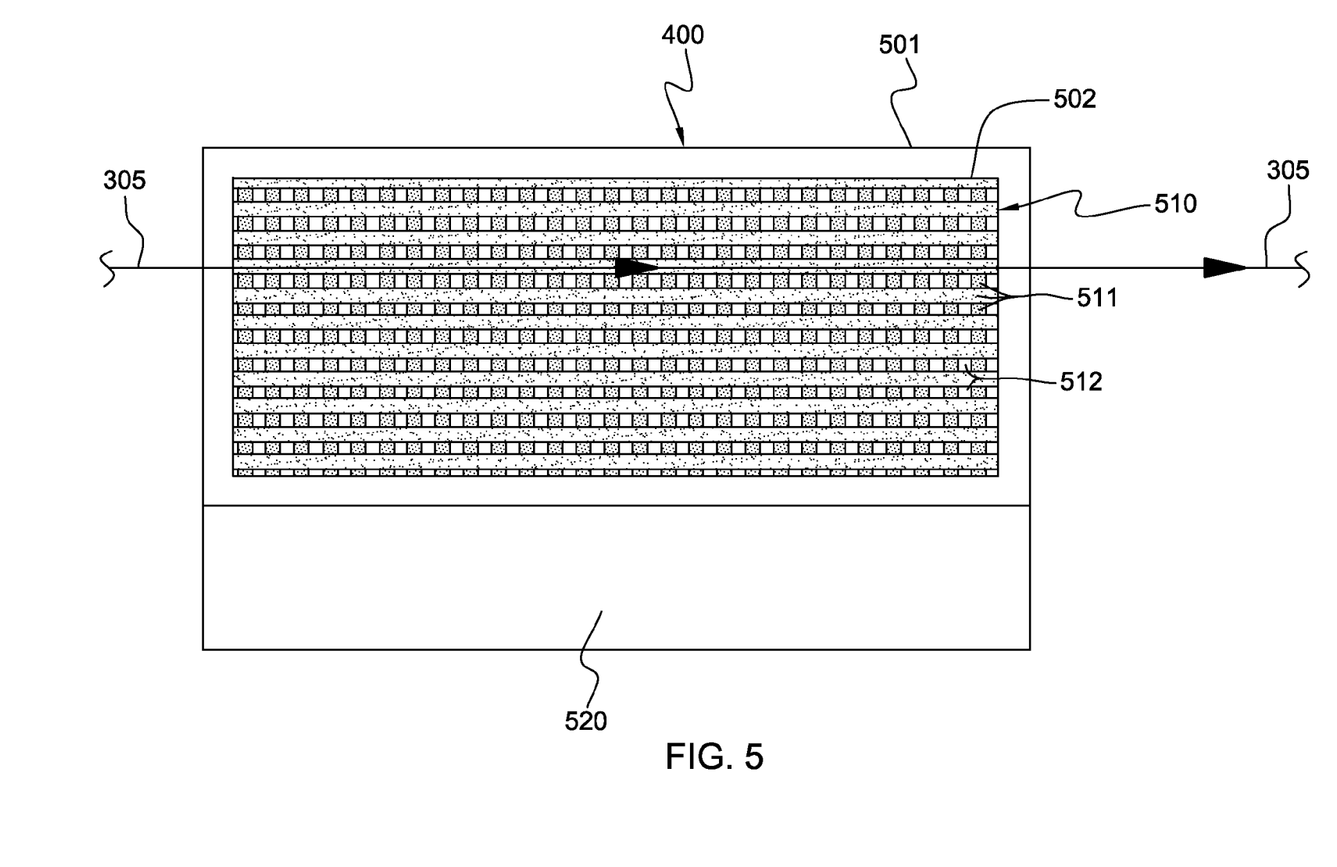
FIG. 5 depicts one embodiment of a contaminant extractor for a vapor-compression refrigeration system, in accordance with one or more aspects aspect of the present invention.

FIG. 5 depicts one embodiment of a contaminant extractor 400 to be employed in a vapor-compression refrigeration system, such as the vapor-compression refrigeration system 300' depicted in FIG. 4. As noted above, and as illustrated in FIG. 5, contaminant extractor 400 includes a refrigerant boiling filter 510 and a heater 520. In the embodiment depicted, refrigerant boiling filter 510 resides within a chamber 502 of a housing 501 of the contaminant extractor, and is coupled in fluid communication with the refrigerant flow path 305, for example, midstream of the condenser 330 (see FIG. 4). In this location, a high-pressure liquid gas refrigerant mixture is directed through the refrigerant boiling filter. Tubing and filter structures of the contaminant extractor are sized to allow a desired portion of the refrigerant flow to be diverted from the condenser through the filter, and a flow restriction such as an orifice or section of small diameter tubing may be used in the refrigerant path through the condenser in a parallel fluid flow to the contaminant extractor to further control the ratio of refrigerant flow that passes through the filter.

By way of example, the refrigerant boiling filter is a fluid-permeable structure which includes a plurality of thermally conductive surfaces across which the high-pressure, liquid gas refrigerant passes. The thermally conductive surfaces are configured and sized to facilitate boiling of the passing refrigeration and deposition of the extracted contaminants onto the surfaces of the filter. Various fluid-permeable structure configurations may be employed, including, for example, a metal foam structure, or an array of thermally conductive fins. For example, multiple sets of parallel fins 511 may be provided as a mesh structure, with openings 512 through which the refrigerant passes.

The extended, thermally conductive surfaces of the refrigerant boiling filter 510 are heated to, for example, a temperature above the boiling temperature of the refrigerant within the condenser 330 (FIG. 4). By heating the boiling filter, the refrigerant passing through the boiling filter is heated, which allows contaminants in the refrigerant to come out of solution within the refrigerant boiling filter, and to become deposited on one of the surfaces of the boiling filter, rather than in a critical component, such as an adjustable expansion valve. As one example, the heater 520 may be a resistive-type heater thermally coupled to housing 501 of contaminant extractor 400, and be formed of or reside in, for example, a thermally conductive material. After boiling within the extractor, the refrigerant is output as high-pressure vapor for return to the condenser 330 (FIG. 4).

In addition to the above-described contaminant extractor, adsorption is an alternative (or additional) filtering approach, which may assist in removing impurities from refrigerant before reaching the one or more expansion devices. In the case of adsorption purification, the high-pressure refrigerant and impurity vapor mixture exiting the compressor is flowed through an in-line container 410 installed in fluid communication with the refrigerant flow path before condenser 330, as illustrated in FIG. 4. This in-line container 410 may comprise solid grains or a mesh, to which the impurity preferentially adsorbs. Thus, the gas mixture leaving the adsorption purifier is comparatively pure and can be condensed and used in the refrigeration cycle. In one embodiment, the adsorption chamber 410 would need to be occasionally replaced or regenerated.

Those skilled in the art will note that the contaminant extractor disclosed herein advantageously facilitates removal of contaminants from the working refrigerant in a designated region, i.e., the refrigerant boiling filter. This designated region is provided to reduce adverse effects of the contaminants coming out of solution in more sensitive portions of the vapor-compression refrigeration system, such as, for example, within an expansion valve. Further, efficient heating by the contaminant extractor is achieved by passing a portion of the refrigerant flow within the condenser through the boiling filter.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. An apparatus for facilitating cooling of an electronic component, the apparatus comprising:
    a vapor-compression refrigeration system comprising a refrigerant expansion component, a refrigerant evaporator, a compressor and a condenser coupled in fluid communication to define a refrigerant flow path and allow the flow of refrigerant therethrough, the refrigerant evaporator being configured to couple to the electronic component; and
    a contaminant extractor coupled in fluid communication with the refrigerant flow path, the contaminant extractor comprising:
        a refrigerant boiling filter, wherein at least a portion of refrigerant passing through the refrigerant flow path passes through the refrigerant boiling filter; and
        a heater for providing heat to the refrigerant boiling filter to boil refrigerant passing through the refrigerant boiling filter, and facilitate deposition in the refrigerant boiling filter of contaminants extracted from the refrigerant due to boiling of the refrigerant in the refrigerant boiling filter.

2. The apparatus of claim 1, wherein the contaminant extractor comprises an intra-condenser extractor coupled in fluid communication and parallel to at least a portion of the refrigerant flow path through the condenser.

3. The apparatus of claim 1, wherein only a portion of the refrigerant flowing through the condenser passes through the refrigerant boiling filter of the contaminant extractor.

4. The apparatus of claim 1, wherein less than 25% of the refrigerant passing through the condenser passes through the refrigerant boiling filter of the contaminant extractor.

5. The apparatus of claim 1, wherein the contaminant extractor is coupled in fluid communication with the refrigerant flow path through the condenser at a location within the condenser where the refrigerant is a liquid-gas mixture.

6. The apparatus of claim 1, wherein the refrigerant received at the refrigerant boiling filter is high-pressure refrigerant with contaminants and refrigerant output from the refrigerant boiling filter is high-pressure refrigerant with a lower concentration of contaminants.

7. The apparatus of claim 1, further comprising an adsorption filter coupled in fluid communication with the refrigerant flow path, the adsorption filter purifying refrigerant vapor within the refrigerant flow path.

8. The apparatus of claim 1, wherein the refrigerant boiling filter comprises a fluid-permeable structure which includes thermally conductive surfaces across which refrigerant passing through the contaminant extractor passes, and wherein the heater heats the thermally conductive surfaces of the fluid-permeable structure across which the refrigerant passes to facilitate boiling of liquid refrigerant and extracting of contaminants from the refrigerant due to heating of the refrigerant, and wherein the thermally conductive surfaces of the fluid-permeable structure are sized to facilitate deposition of the contaminants thereon.

9. The apparatus of claim 1, wherein the refrigerant boiling filter comprises one of a metal foam structure, metal mesh or screen structure, or an array of thermally conductive fins.

10. A cooled electronic system comprising:
at least one heat-generating electronic component;
a vapor-compression refrigeration system coupled to the at least one heat-generating electronic component, the vapor-compression refrigeration system comprising:
a refrigerant expansion component;
a refrigerant evaporator, the refrigerant evaporator being coupled to the at least one heat-generating electronic component;
a compressor; and
a condenser;
a refrigerant flow path coupling in fluid communication the refrigerant expansion component, the refrigerant evaporator, the compressor, and the condenser; and
a contaminant extractor coupled in fluid communication with the refrigerant flow path, the contaminant extractor comprising:
a refrigerant boiling filter, wherein at least a portion of refrigerant passing through the refrigerant flow path passes through the refrigerant boiling filter; and
a heater for providing heat to the refrigerant boiling filter to boil refrigerant passing through the refrigerant boiling filter, and facilitate deposition in the refrigerant boiling filter of contaminants extracted from the refrigerant due to boiling of the refrigerant in the refrigerant boiling filter.

11. The cooled electronic system of claim 10, wherein the contaminant extractor comprises an intra-condenser extractor coupled in fluid communication and parallel to at least a portion of the refrigerant flow path through the condenser.

12. The cooled electronic system of claim 10, wherein only a portion of the refrigerant flowing through the condenser passes through the refrigerant boiling filter of the contaminant extractor.

13. The cooled electronic system of claim 10, wherein less than 25% of the refrigerant passing through the condenser passes through the refrigerant boiling filter of the contaminant extractor.

14. The cooled electronic system of claim 10, wherein the contaminant extractor is coupled in fluid communication with the refrigerant flow path through the condenser at a location within the condenser where the refrigerant is a liquid-gas mixture.

15. The cooled electronic system of claim 10, wherein the refrigerant received at the refrigerant boiling filter is high-pressure refrigerant with contaminants and refrigerant output from the refrigerant boiling filter is high-pressure refrigerant with a lower concentration of contaminants.

16. The cooled electronic system of claim 10, further comprising an adsorption filter coupled in fluid communication with the refrigerant flow path, the adsorption filter purifying refrigerant vapor within the refrigerant flow path.

17. The cooled electronic system of claim 10, wherein the refrigerant boiling filter comprises a fluid-permeable structure which includes thermally conductive surfaces across which refrigerant passing through the contaminant extractor passes, and wherein the heater heats the thermally conductive surfaces of the fluid-permeable structure across which the refrigerant passes to facilitate boiling of liquid refrigerant and extracting of contaminants from the refrigerant due to heating of the refrigerant, and wherein the thermally conductive surfaces of the fluid-permeable structure are sized to facilitate deposition of the contaminants thereon.

18. The cooled electronic system of claim 10, wherein the refrigerant boiling filter comprises one of a metal foam structure, metal mesh or screen structure, or an array of thermally conductive fins.

19. A method of fabricating a vapor-compression refrigeration system for cooling at least one heat-generating electronic component, the method comprising:
providing a condenser, a refrigerant expansion structure, a refrigerant evaporator, and a compressor;
coupling the condenser, refrigerant expansion structure, refrigerant evaporator and compressor in fluid communication to define a refrigerant flow path;
providing a contaminant extractor in fluid communication with the refrigerant flow path, the contaminant extractor comprising:
a refrigerant boiling filter, wherein at least a portion of refrigerant passing through the refrigerant flow path passes through the refrigerant boiling filter; and
a heater providing heat to the refrigerant boiling filter to boil refrigerant passing through the refrigerant boiling filter, and facilitate deposition in the refrigerant boiling filter of contaminants extracted from the refrigerant due to boiling of the refrigerant in the refrigerant boiling filter; and
providing refrigerant within the refrigerant flow path of the vapor-compression refrigeration system to allow for cooling of the at least one heat-generating electronic component employing sequential vapor-compression cycles, wherein the contaminant extractor removes contaminants from the refrigerant commensurate with the sequential vapor-compression cycles.

20. The method of claim 19, wherein the contaminant extractor comprises an intra-condenser extractor coupled in fluid communication and parallel to at least a portion of the refrigerant flow path through the condenser.

* * * * *